United States Patent
Sriraman

(10) Patent No.: US 12,068,152 B2
(45) Date of Patent: Aug. 20, 2024

(54) SEMICONDUCTOR SUBSTRATE BEVEL CLEANING

(71) Applicant: LAM RESEARCH CORPORATION, Fremont, CA (US)

(72) Inventor: Saravanapriyan Sriraman, Fremont, CA (US)

(73) Assignee: Lam Research Corporation, Fremont, CA (US)

( * ) Notice: Subject to any disclaimer, the term of this patent is extended or adjusted under 35 U.S.C. 154(b) by 193 days.

(21) Appl. No.: 17/767,228

(22) PCT Filed: Oct. 8, 2020

(86) PCT No.: PCT/US2020/054663
§ 371 (c)(1),
(2) Date: Apr. 7, 2022

(87) PCT Pub. No.: WO2021/071999
PCT Pub. Date: Apr. 15, 2021

(65) Prior Publication Data
US 2022/0375746 A1 Nov. 24, 2022

Related U.S. Application Data

(60) Provisional application No. 62/913,427, filed on Oct. 10, 2019.

(51) Int. Cl.
*H01L 21/02* (2006.01)
*H01J 37/32* (2006.01)

(52) U.S. Cl.
CPC .. *H01L 21/02087* (2013.01); *H01J 37/32385* (2013.01); *H01J 37/3244* (2013.01); *H01J 37/32532* (2013.01); *H01L 21/02057* (2013.01)

(58) Field of Classification Search
None
See application file for complete search history.

(56) References Cited

U.S. PATENT DOCUMENTS

| 8,329,593 | B2 | 12/2012 | Yousif et al. |
| 2007/0068899 | A1 | 3/2007 | Yoon |
| 2007/0251919 | A1 | 11/2007 | Imai |
| 2008/0179297 | A1 | 7/2008 | Bailey et al. |

FOREIGN PATENT DOCUMENTS

| KR | 20100108375 A | 10/2010 |
| WO | WO-2009036218 A1 | 3/2009 |

OTHER PUBLICATIONS

International Search Report and Written Opinion of the ISA issued in PCT/US2020/054663, mailed Feb. 1, 2021; ISA/KR. 4 page ISR + 4 page WO = 8 total pages.

*Primary Examiner* — Eric W Golightly

(57) ABSTRACT

A system for performing a bevel cleaning process on a substrate includes a substrate support including an electrode and a plurality of plasma needles arranged around a perimeter of the substrate support. The plasma needles are in fluid communication with a gas delivery system and are configured to supply reactive gases from the gas delivery system to a bevel region of the substrate when the substrate is arranged on the substrate support and electrically couple to the electrode of the substrate support and generate plasma around the bevel region of the substrate.

9 Claims, 4 Drawing Sheets

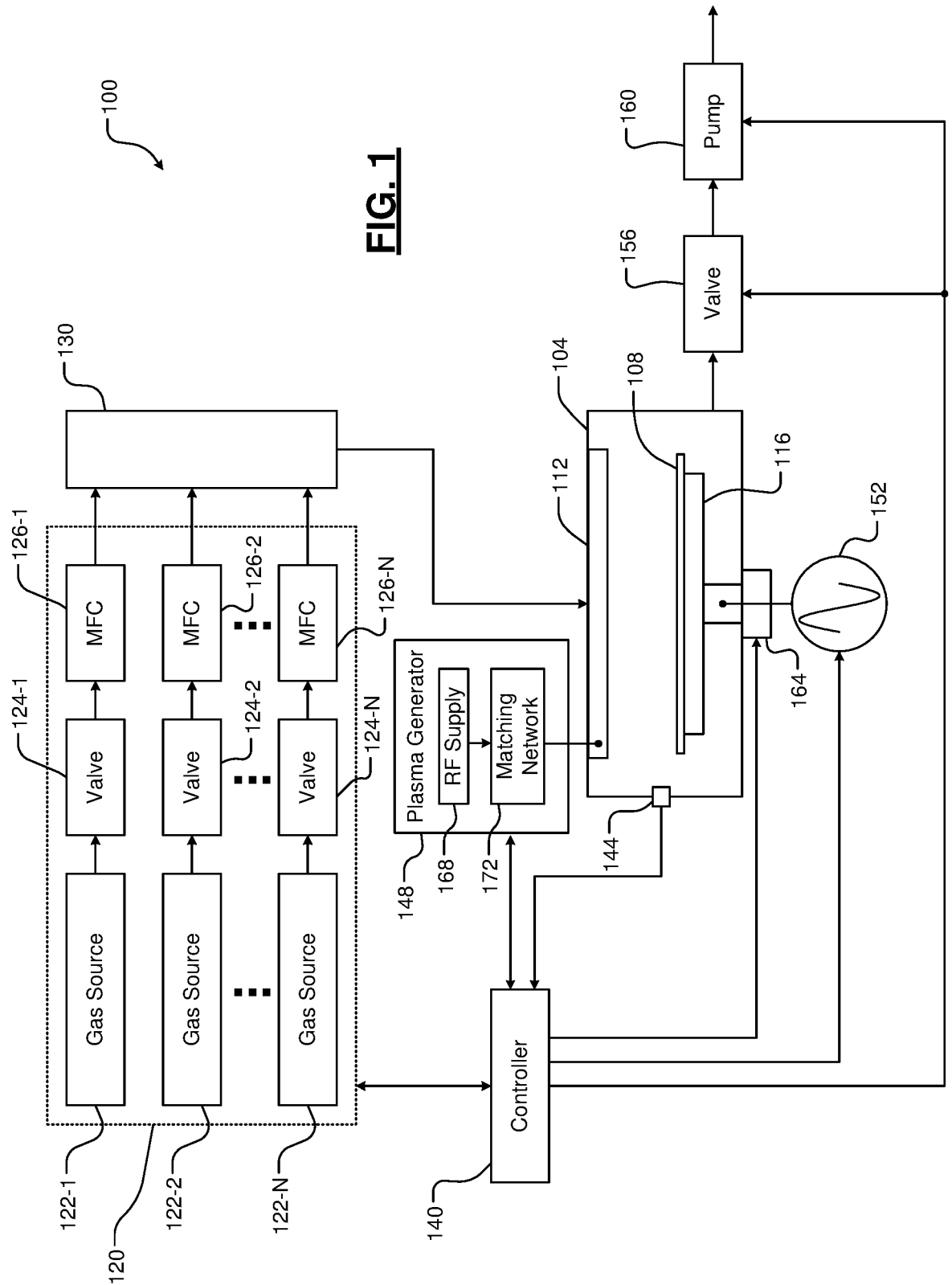

SEMICONDUCTOR SUBSTRATE BEVEL CLEANING

CROSS-REFERENCE TO RELATED APPLICATIONS

This application is a U.S. National Phase Application under 35 U.S.C. 371 of International Application No. PCT/US2020/054663, filed on Oct. 8, 2020, which claims the benefit of U.S. Provisional Application No. 62/913,427, filed on Oct. 10, 2019. The entire disclosures of the applications referenced above are incorporated herein by reference.

FIELD

The present disclosure relates to systems and methods for cleaning deposits from bevel and backside regions of semiconductor substrates.

BACKGROUND

The background description provided here is for the purpose of generally presenting the context of the disclosure. Work of the presently named inventors, to the extent it is described in this background section, as well as aspects of the description that may not otherwise qualify as prior art at the time of filing, are neither expressly nor impliedly admitted as prior art against the present disclosure.

Substrate processing systems may be used to perform deposition of film on a substrate, such as a semiconductor wafer. Substrate processing systems typically include a processing chamber defining a reaction volume. A substrate support such as a pedestal, a chuck, a plate, etc. is arranged in the processing chamber. A substrate such as a semiconductor wafer may be arranged on the substrate support. During atomic layer deposition (ALD), one or more ALD cycles are performed to deposit film on the substrate. For plasma-based ALD, each ALD cycle includes precursor dose, purge, RF plasma dose, and purge steps.

SUMMARY

A system for performing a bevel cleaning process on a substrate includes a substrate support including an electrode and a plurality of plasma needles arranged around a perimeter of the substrate support. The plasma needles are in fluid communication with a gas delivery system and are configured to supply reactive gases from the gas delivery system to a bevel region of the substrate when the substrate is arranged on the substrate support and electrically couple to the electrode of the substrate support and generate plasma around the bevel region of the substrate.

In other features, the system further includes a central injector configured to supply a purge gas above the substrate while the plasma is generated around the bevel region of the substrate. The plurality of plasma needles includes N plasma needles arranged at respective ones of N azimuthal positions around the substrate support. The N plasma needles are uniformly spaced around the substrate support. The substrate support is configured to rotate. The substrate support is configured to rotate to control exposure of different portions of the bevel region to the plasma.

In other features, the system further includes an actuator configured to rotate the substrate support. The system further includes a controller configured to control rotation of the substrate support using the actuator. The controller is configured to rotate the substrate support based on data indicative of characteristics of the substrate. The plurality of plasma needles includes M plasma needles and wherein the M plasma needles include N pairs of the plasma needles arranged at respective ones of N azimuthal positions around the substrate support.

A system for performing a bevel cleaning process on a substrate includes a substrate support including an electrode and at least one edge electrode arranged around a perimeter of the substrate support. The edge electrode defines a volume around a bevel region of the substrate when the substrate is arranged on the substrate support. The edge electrode is in fluid communication with a gas delivery system and the edge electrode is configured to supply reactive gases from the gas delivery system to the volume and receive power to generate plasma within the volume.

In other features, the system further includes a central injector configured to supply a purge gas above the substrate while the plasma is generated within the volume. The at least one edge electrode includes N edge electrodes arranged at respective ones of N azimuthal positions around the substrate support. The N edge electrodes are uniformly spaced around the substrate support. The substrate support is configured to rotate. The substrate support is configured to rotate to control exposure of different portions of the bevel region to the plasma.

In other features, the system further includes an actuator configured to rotate the substrate support. The system further includes a controller configured to control rotation of the substrate support using the actuator. The controller is configured to rotate the substrate support based on data indicative of characteristics of the substrate. The edge electrode includes an upper electrode and a lower electrode and the upper electrode is connected to a power source configured to provide the power to generate the plasma within the volume.

In other features, the upper electrode and the lower electrode are radiused. The edge electrode is "U"-shaped. The edge electrode includes a gas inlet arranged to supply the reactive gases to the volume and a gas outlet. The edge electrode includes an upper portion and a lower portion, and the lower portion is configured to be movable relative to the upper portion. The edge electrode corresponds to a continuous annular edge electrode that encircles the substrate support.

Further areas of applicability of the present disclosure will become apparent from the detailed description, the claims and the drawings. The detailed description and specific examples are intended for purposes of illustration only and are not intended to limit the scope of the disclosure.

BRIEF DESCRIPTION OF THE DRAWINGS

The present disclosure will become more fully understood from the detailed description and the accompanying drawings, wherein:

FIG. 1 is a functional block diagram of an example of a substrate processing system according to the present disclosure;

In the drawings, reference numbers may be reused to identify similar and/or identical elements.

DETAILED DESCRIPTION

Figure 2A:
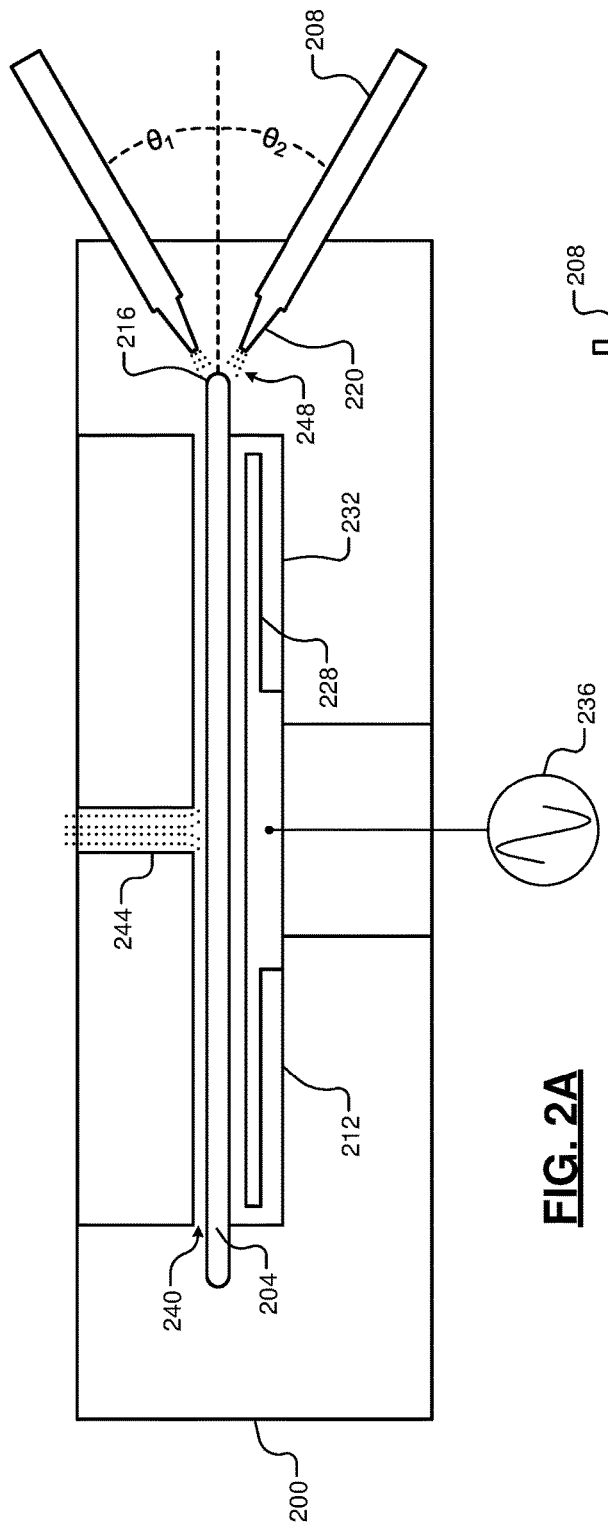
FIG. 2A is an example processing chamber configured to perform a bevel cleaning process on a substrate according to the present disclosure.

During deposition of film onto the substrate, deposition may also occur in locations other than the top portion of the substrate where it is desired. For example, deposition may occur along a backside edge of the substrate (e.g., "backside edge deposition"). The backside edge deposition may cause problems during subsequent processing. In spacer applications, backside edge deposition may cause defocusing issues during subsequent lithography steps.

Further, an edge region (e.g., an outermost 2 mm) and/or bevel region of the substrate may not be used in subsequent manufacturing steps. However, unwanted film deposition may also occur on the edge and bevel regions of the substrate. In some examples, particles may be deposited onto the edge and bevel regions during other processing steps. The deposited films and particles may cause various problems during subsequent processing steps. For example, the films and particles may be re-deposited onto other regions of the substrate, inter-level dielectric (ILD) oxide deposited in the bevel region can damage patterns formed on the substrate during contact etching, thermal treatments of the substrate can cause stress in the bevel region, etc.

In some examples, backside edge deposition may be reduced by minimizing or eliminating flow of precursor to the backside of the substrate during a precursor dose. In other examples, plasma wrap to the backside of the substrate may be minimized or eliminated. In still other examples, a purge gas (e.g., argon, oxygen, nitrous oxide, etc) may be directed at the backside edge of the substrate. However, even when using the purge gas or other mechanisms for reducing backside edge, edge region, and/or bevel region deposition, edge and bevel region deposition may still occur.

A cleaning process may be performed on the substrates to remove film and particle deposits and to improve product yields and quality. In some examples, substrates are arranged on a powered lower electrode (e.g., a pedestal or other substrate support) between two grounded electrodes in a cleaning process chamber. A purge gas (e.g., molecular nitrogen, or $N_2$) is flowed into the cleaning process chamber via a central injector while reactive gases are directed toward the edge regions of the substrates. Radio frequency (RF) power is provided to generate plasma at the edge regions to etch and remove the deposited film and/or particles from the edge regions. For example only, the provided RF power may be relatively low (e.g., 300-600 watts at 10-15 MHz) with respect to conventional etching processes, reducing power efficiency. Further, a non-optimal power coupling path to the substrate may cause sputtering of materials from the lower electrode during the cleaning process.

Systems and methods according to the principles of the present disclosure implement improved bevel processing including etching and deposition processes. For example, a bevel etching process provides improved cleaning of deposited films and particles from the edge/bevel regions of substrates. In one example, one or more plasma needles or jets are arranged around a perimeter of the substrate support. One or more reactive gases (e.g., argon (Ar), sulfur hexafluoride ($SF_6$), carbon tetrafluoromethane ($CF_4$), nitrogen trifluoride ($NF_3$), molecular oxygen ($O_2$), molecular nitrogen ($N_2$), molecular hydrogen ($H_2$), carbon dioxide ($CO_2$), halogens such as chlorine ($Cl_2$) and hydrogen bromide (HBr), etc.) are provided via the plasma needles while an RF bias power is provided to the substrate support to generate plasma using the needles. For example, a negative bias applied to the substrate support attracts ions to the edge/bevel region of the substrate. Same or different reactive gases may be supplied via respective plasma needles, and/or the reactive gases may be supplied at same or different rates via respective plasma needles. In some examples, a purge gas may be provided from a center injector. The plasma needles are arranged such that coupling occurs only at the edge/bevel region of the substrate.

In some examples, the plasma needles are arranged azimuthally around the substrate support and the substrate support is configured to rotate to uniformly expose portions of the edge/bevel region to the plasma generated by the plasma needles. A rotation speed of the substrate support and a number of the plasma needles may be selected to control etch and deposition rates at the edge/bevel region of the substrate.

In another example, one or more edge electrodes are provided to surround respective portions of the edge/bevel region. For example, a plurality of the edge electrodes may be azimuthally arranged around the substrate support and the substrate support is optionally rotated. Alternatively, a single, continuous edge electrode is arranged to surround the edge/bevel region. One or more reactive gases are provided via the edge electrodes and a purge gas may be provided from the center injector. RF power is provided to the edge electrodes to generate plasma. An RF bias power may be provided to the substrate support or the substrate support may be floating or grounded. A negative DC bias thereby generated on the substrate attracts ions to the edge/bevel region.

Although described below with respect to etching the edge/bevel region, the principles of the present disclosure may also be implemented to perform other bevel processing such as depositing films on the edge/bevel region. For example, instead of supplying the reactive gases as described above, the plasma needles may be controlled to provide deposition precursors (e.g., silane ($SiH_4$) and/or other deposition precursors) to deposit a film on the edge/bevel region. Subsequent to depositing the film, one or more reactive (i.e., etch) gases may be provided to etch the deposited film. Accordingly, the bevel processing described in the present disclosure may include etching the edge/bevel region, depositing onto the edge/bevel region, and combinations thereof.

Referring now to FIG. 1, an example substrate processing system 100 including a processing chamber 104 configured for performing a cleaning process for removing deposited films and/or particles from an edge/bevel region of a substrate 108 is shown. For simplicity, deposited films and/or particles may be referred to as "materials" and the edge/bevel region may be referred to as a bevel or bevel region herein. Process gases may be supplied to the processing chamber 104 using a gas distribution device 112 such as a central injector, showerhead, or other device. The substrate 108 may be arranged on a substrate support 116 during processing. The substrate support 116 may include a pedestal, an electrostatic chuck, a mechanical chuck or other type of substrate support. In some examples, the substrate support may be configured to rotate.

A gas delivery system 120 may include one or more gas sources 122-1, 122-2, . . . , and 122-N (referred to collectively as gas sources 122), where N is an integer greater than one. Valves 124-1, 124-2, . . . , and 124-N (referred to collectively as valves 124), mass flow controllers 126-1, 126-2, . . . , and 126-N (referred to collectively as mass flow controllers 126), or other flow control devices may be used to controllably supply a precursor dose, a plasma gas mixture, inert gases, purge gases, and mixtures thereof to a manifold 130, which supplies the gas mixture to the processing chamber 104. Although as shown the gas mixture is supplied to the processing chamber 104 via gas distribution device 112, the gas mixture may also be supplied to one or more plasma needles, edge electrodes, etc. (not shown in FIG. 1) according to the principles of the present disclosure as described below in more detail.

A controller 140 may be used to monitor process parameters such as temperature, pressure etc. (e.g., using sensors 144) and to control process timing. The controller 140 may be used to control process devices such as the gas delivery system 120, an RF plasma generator 148, an RF bias power source 152, etc. Although shown connected to the RF bias power source 152, in other examples the substrate support 116 (which may function as a lower electrode) may be floating or connected to ground. The controller 140 may also be used to evacuate the processing chamber 104 using a valve 156 and pump 160. In some examples, the controller 140 may control an actuator 164 to selectively rotate the substrate support 116.

The RF plasma generator 148 generates RF plasma in the processing chamber 104. The RF plasma generator 148 may be an inductive or capacitive-type RF plasma generator. In some examples, the RF plasma generator 148 may include an RF supply 168 and a matching and distribution network 172. The RF plasma generator 148 as shown provides RF power to the gas distribution device 112 to generate plasma within the processing chamber 104. In other examples, the RF plasma generator 148 may also be configured to provide power to an edge electrode as described below in more detail.

Figure 2B:
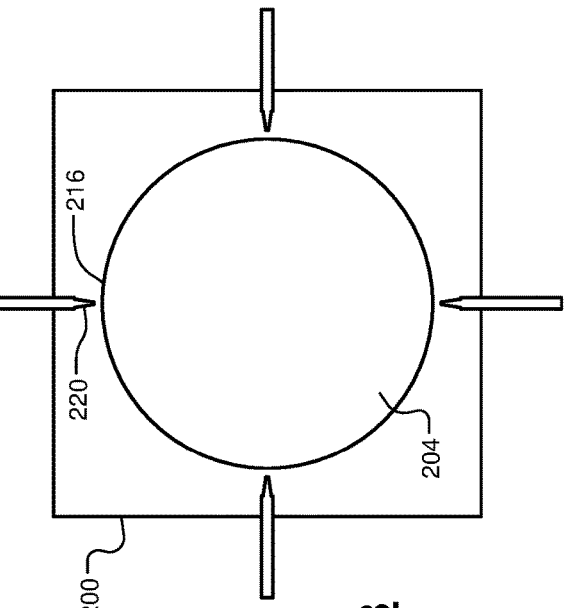
FIG. 2B is a plan view of the processing chamber of FIG. 2A.

Referring now to FIGS. 2A and 2B, an example processing chamber 200 configured to perform a bevel cleaning process on a substrate 204 according to the present disclosure is shown in more detail. The substrate 204 is shown in a plan view in FIG. 2B. In this example, the processing chamber 200 includes one or more bevel cleaning gas injectors, such as plasma needles 208. The substrate 204 is arranged on a substrate support 212 and the plasma needles 208 are azimuthally arranged (e.g., at N positions) around a perimeter of the substrate 204. As shown, N=4. The plasma needles 208 may be arranged to extend through a wall of the processing chamber 200 (as shown) or may be arranged entirely within the processing chamber 200.

More specifically, the plasma needles 208 are arranged around a bevel region 216 of the substrate 204. For example, the plasma needles 208 are positioned such that ends 220 of the plasma needles 208 are directed at the bevel region 216. In some examples (as shown), two of the plasma needles 208 are arranged at a same one of the N positions. In other examples, only one of the plasma needles 208 may be provided at each of the N positions.

One or more reactive gases are supplied to the plasma needles 208 (e.g., via a gas delivery system, such as the gas delivery system 120 as described in FIG. 1). The reactive gases flow out of the ends 220 of the plasma needles 208 toward the bevel region 216 of the substrate 204 while RF bias power is provided to the substrate support 212. For example, the substrate support 212 may include a conductive (e.g., metal) electrode 228 enclosed within a dielectric 232. An RF bias power is supplied to the electrode 228 (e.g., using an RF bias power source 236). The plasma needles 208 are arranged such that coupling between the plasma needles 208 and the electrode 228 occurs only at the bevel region 216 of the substrate 204. Further, a purge gas may be supplied into a volume 240 above the substrate support 212 (e.g., using a central injector 244). Accordingly, plasma is generated in (and limited to) a region 248 between the ends 220 of the plasma needles 208 and the bevel region 216 to clean (e.g., etch) material from the bevel region 216. The number N of the plasma needles 208, angles (e.g., $\theta_1$ and $\theta_2$, which may be the same or different) of the plasma needles 208 relative to a horizontal orientation of the substrate 204, etc. may be selected and/or adjusted to control exposure of the bevel region 216 to the plasma.

In some examples, the substrate support 212 is configured to rotate to control exposure of different portions of the bevel region 216 to the plasma generated in the region 248. A rotation speed of the substrate support 212 may be selected to control etch (and/or deposition) rates at the bevel region 216. For example, the substrate support 212 may be configured to rotate in response to commands from a controller (e.g., the controller 140). The controller 140 may be configured to rotate the substrate support 212 to uniformly expose portions of the bevel region 216 to the plasma during the bevel cleaning process. Alternatively, the controller 140 may be configured to rotate the substrate support 212 to expose selected portions of the bevel region 216 to plasma for greater or lesser periods during the bevel cleaning process (e.g., in accordance with data indicative of characteristics of a particular substrate, results of previous process steps performed on the substrate 204, etc.). Accordingly, exposure of respective portions of the bevel region 216 to the plasma during the bevel cleaning process may be uniform or non-uniform.

Figure 3A:
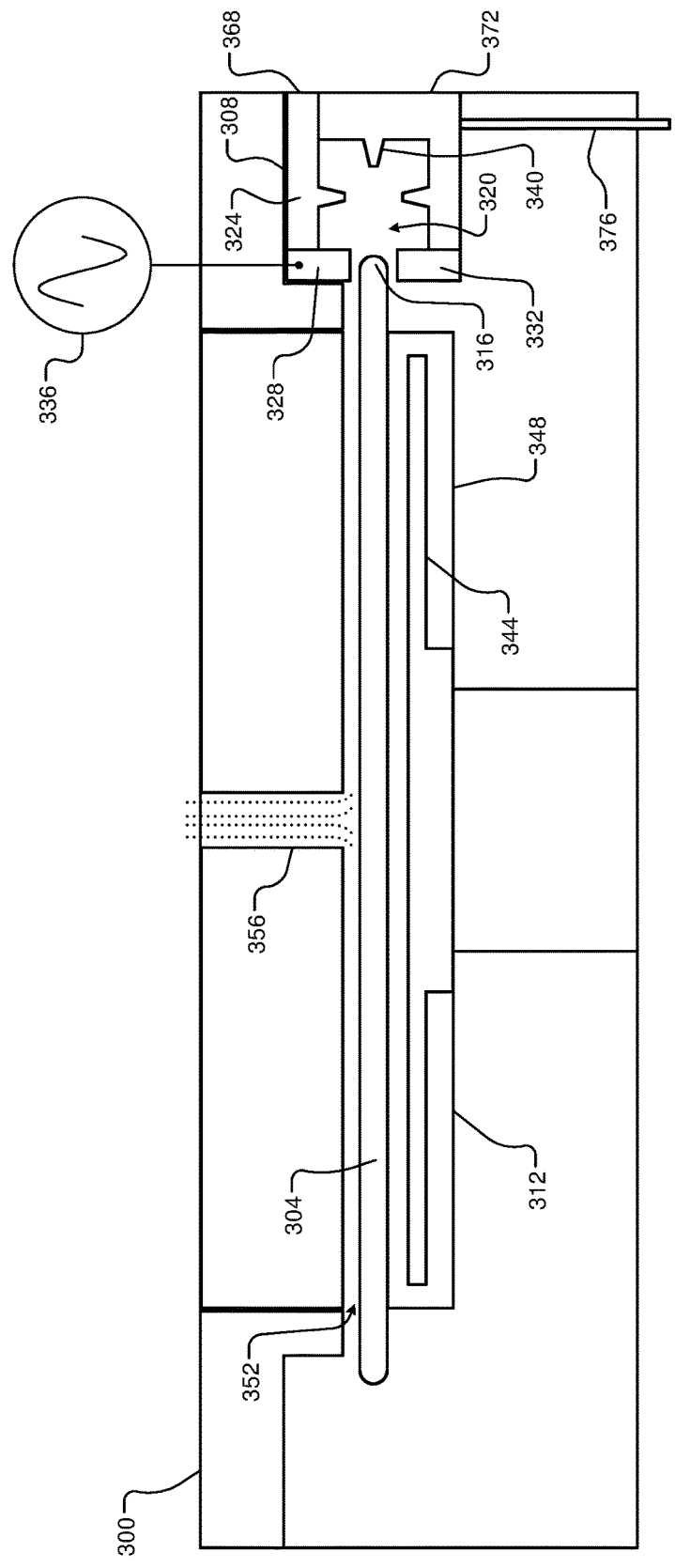
FIG. 3A is another example processing chamber configured to perform a bevel cleaning process on a substrate according to the present disclosure.
Figure 3C:
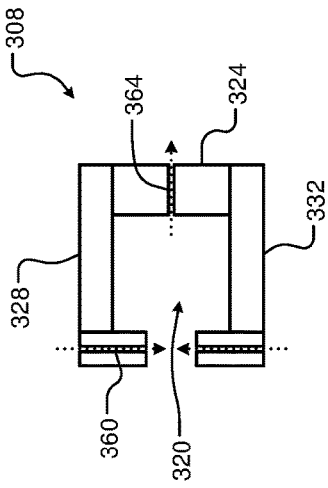
FIG. 3C shows another example edge electrode according to the present disclosure.
Figure 3B:
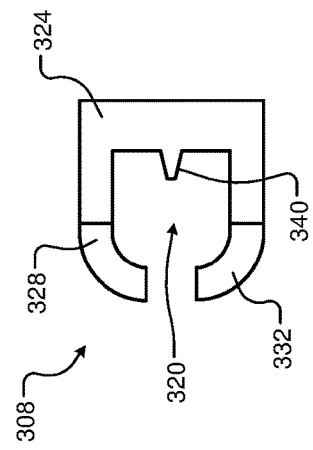
FIG. 3B shows an example edge electrode according to the present disclosure.

Referring now to FIGS. 3A, 3B, and 3C, another example processing chamber 300 configured to perform a bevel cleaning process on a substrate 304 according to the present disclosure is shown in more detail. In this example, the processing chamber 300 includes one or more edge electrodes 308 functioning as bevel cleaning gas injectors. The substrate 304 is arranged on a substrate support 312. In examples where the processing chamber 300 includes more than one of the edge electrodes 308, the edge electrodes 308 may be azimuthally arranged (e.g., at N positions) around a perimeter of the substrate 304 similar to the arrangement of the plasma needles 208 as described above in FIGS. 2A and 2B.

Accordingly, the edge electrodes 308 are arranged around a bevel region 316 of the substrate 304. For example, the edge electrodes 308 are positioned to partially enclose the bevel region 316. For example, the bevel region 316 extends into a volume 320 defined within the edge electrodes 308. As shown in FIG. 3A, the edge electrodes 308 have a generally rectangular, "U"-shaped cross-section defining the volume 320. Each of the edge electrodes 308 may include a body 324, an upper electrode 328, and a lower electrode 332. For example only, the body 324 may comprise a dielectric material and the upper electrode 328 and the lower electrode 332 are conductive. The upper electrode 328 and the lower electrode 332 are not in contact with the bevel region 316. An RF power source 336 provides RF power (e.g., as a positive voltage) to the upper electrode 328. The lower electrode 332 may be grounded or connected to a negative voltage.

One or more reactive gases are supplied to the edge electrodes 308 (e.g., via a gas delivery system, such as the gas delivery system 120 as described in FIG. 1). The reactive gases flow out of one or more nozzles 340 into the volume 320 while RF power is provided to the upper electrode 328. The substrate support 312 may include a conductive (e.g., metal) electrode 344 enclosed within a dielectric 348 and the substrate support 312 may be floating or powered. Further, a purge gas may be supplied into a volume 352 above the substrate support 212 (e.g., using a central injector 356). Accordingly, plasma is generated in (and limited to) the volume 320 within the edge electrodes 308 to clean material from the bevel region 316. The number N of the edge electrodes may be selected and/or adjusted to control exposure of the bevel region 316 to the plasma.

In some examples, the substrate support 312 is configured to rotate to control exposure of different portions of the bevel region 316 to the plasma generated in the volume 320. A rotation speed of the substrate support 312 may be selected to control etch (and/or deposition) rates at the bevel region 316. For example, the substrate support 312 may be configured to rotate in response to commands from a controller (e.g., the controller 140). The controller 140 may be configured to rotate the substrate support 312 to uniformly expose portions of the bevel region 316 to the plasma during the bevel cleaning process. Alternatively, the controller 140 may be configured to rotate the substrate support 312 to expose selected portions of the bevel region 316 to plasma for greater or lesser periods during the bevel cleaning process (e.g., in accordance with data indicative of characteristics of a particular substrate, results of previous process steps performed on the substrate 304, etc.). Accordingly, exposure of respective portions of the bevel region 316 to the plasma during the bevel cleaning process may be uniform or non-uniform.

FIG. 3B shows another example of the edge electrode 308. In this example, the edge electrode 308 is not rectangular as shown in FIG. 3A. Instead, the upper electrode 328 and the lower electrode 332 are radiused. In other examples, the edge electrode 308 may have other suitable shapes defining the volume 320.

As shown in FIG. 3C, the edge electrode 308 may include one or more gas inlets 360 (e.g., instead of the nozzles 340) and a gas outlet 364. The reactive gases are supplied to the volume 320 via the gas inlets 360. Conversely, the reactive gases exit the volume 320 via the gas outlet 364.

In some examples, the edge electrode 308 may correspond to a single, continuous annular edge electrode encircling the substrate support 312. In these examples, rotating the substrate support 312 may not be required to achieve uniform exposure of the bevel region 316 to plasma within the volume 320. Further, the edge electrode 308 may include an upper portion 368 and a lower portion 372. The upper portion 368 may be fixedly attached to an upper surface or other structure of the processing chamber 300 while the lower portion 372 may be raised and lowered. For example, the lower portion 372 may be lowered to facilitate transfer of the substrate 304 to the substrate support 312 and raised to enclose the bevel region 316 when the substrate 304 is in position. For example only, the lower portion 372 may be raised and lowered using one or more lift pins 376.

Figure 4:
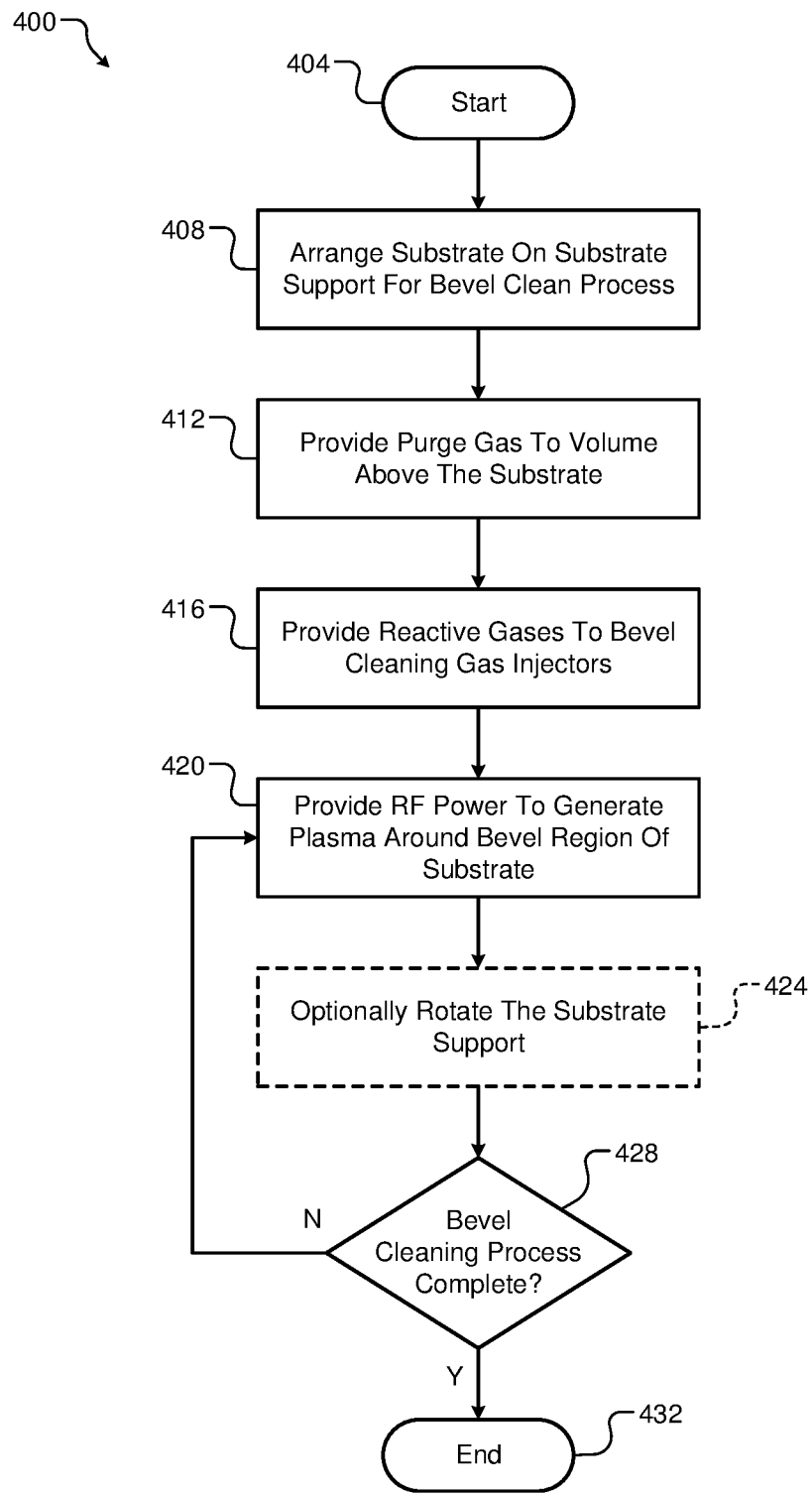
FIG. 4 illustrates steps of an example method for cleaning a bevel region of a substrate according to the present disclosure.

Referring now to FIG. 4, an example method 400 for cleaning a bevel region of a substrate begins at 404. At 408, a substrate is arranged on a substrate support. In some examples, arranging the substrate on the substrate support includes lowering a lower portion of an edge electrode, arranging the substrate on the substrate support, and raising the lower portion to enclose the bevel region as described above. At 412, purge gas is provided to a volume above the substrate. At 416, reactive gases are provided to one or more bevel cleaning gas injectors such as plasma needles 208 or edge electrodes 308.

At 420, RF power is provided to generate plasma in a region around the bevel region. For example, RF power may be provided to an electrode of the substrate support, to one or more electrodes of an edge electrode, etc. At 424, the substrate support is optionally rotated. At 428, the method 400 determines whether the bevel cleaning process is complete. For example, a controller (e.g., the controller 140) may be configured to continue the bevel cleaning process for a predetermined period, a predetermined number of revolutions of the substrate support, etc. If true, the method 400 ends at 432. If false, the method 400 continues to 420 to continue to generate plasma and clean the bevel region. Although described above with respect to cleaning the bevel region, in other examples a similar method can be used to deposit material onto the bevel region.

The foregoing description is merely illustrative in nature and is in no way intended to limit the disclosure, its application, or uses. The broad teachings of the disclosure can be implemented in a variety of forms. Therefore, while this disclosure includes particular examples, the true scope of the disclosure should not be so limited since other modifications will become apparent upon a study of the drawings, the specification, and the following claims. It should be understood that one or more steps within a method may be executed in different order (or concurrently) without altering the principles of the present disclosure. Further, although each of the embodiments is described above as having certain features, any one or more of those features described with respect to any embodiment of the disclosure can be implemented in and/or combined with features of any of the other embodiments, even if that combination is not explicitly described. In other words, the described embodiments are not mutually exclusive, and permutations of one or more embodiments with one another remain within the scope of this disclosure.

Spatial and functional relationships between elements (for example, between modules, circuit elements, semiconductor layers, etc.) are described using various terms, including "connected," "engaged," "coupled," "adjacent," "next to," "on top of," "above," "below," and "disposed." Unless explicitly described as being "direct," when a relationship between first and second elements is described in the above disclosure, that relationship can be a direct relationship where no other intervening elements are present between the first and second elements, but can also be an indirect relationship where one or more intervening elements are present (either spatially or functionally) between the first and second elements. As used herein, the phrase at least one of A, B, and C should be construed to mean a logical (A OR B OR C), using a non-exclusive logical OR, and should not be construed to mean "at least one of A, at least one of B, and at least one of C."

In some implementations, a controller is part of a system, which may be part of the above-described examples. Such systems can comprise semiconductor processing equipment, including a processing tool or tools, chamber or chambers, a platform or platforms for processing, and/or specific processing components (a wafer pedestal, a gas flow system, etc.). These systems may be integrated with electronics for controlling their operation before, during, and after processing of a semiconductor wafer or substrate. The electronics may be referred to as the "controller," which may control various components or subparts of the system or systems. The controller, depending on the processing requirements and/or the type of system, may be programmed to control any of the processes disclosed herein, including the delivery of processing gases, temperature settings (e.g., heating and/or cooling), pressure settings, vacuum settings, power settings, radio frequency (RF) generator settings, RF matching circuit settings, frequency settings, flow rate settings, fluid delivery settings, positional and operation settings, wafer transfers into and out of a tool and other transfer tools and/or load locks connected to or interfaced with a specific system.

Broadly speaking, the controller may be defined as electronics having various integrated circuits, logic, memory, and/or software that receive instructions, issue instructions, control operation, enable cleaning operations, enable endpoint measurements, and the like. The integrated circuits may include chips in the form of firmware that store program instructions, digital signal processors (DSPs), chips defined as application specific integrated circuits (ASICs), and/or one or more microprocessors, or microcontrollers that execute program instructions (e.g., software). Program instructions may be instructions communicated to the controller in the form of various individual settings (or program files), defining operational parameters for carrying out a particular process on or for a semiconductor wafer or to a system. The operational parameters may, in some embodiments, be part of a recipe defined by process engineers to accomplish one or more processing steps during the fabrication of one or more layers, materials, metals, oxides, silicon, silicon dioxide, surfaces, circuits, and/or dies of a wafer.

The controller, in some implementations, may be a part of or coupled to a computer that is integrated with the system, coupled to the system, otherwise networked to the system, or a combination thereof. For example, the controller may be in the "cloud" or all or a part of a fab host computer system, which can allow for remote access of the wafer processing. The computer may enable remote access to the system to monitor current progress of fabrication operations, examine a history of past fabrication operations, examine trends or performance metrics from a plurality of fabrication operations, to change parameters of current processing, to set processing steps to follow a current processing, or to start a new process. In some examples, a remote computer (e.g. a server) can provide process recipes to a system over a network, which may include a local network or the Internet. The remote computer may include a user interface that enables entry or programming of parameters and/or settings, which are then communicated to the system from the remote computer. In some examples, the controller receives instructions in the form of data, which specify parameters for each of the processing steps to be performed during one or more operations. It should be understood that the parameters may be specific to the type of process to be performed and the type of tool that the controller is configured to interface with or control. Thus as described above, the controller may be distributed, such as by comprising one or more discrete controllers that are networked together and working towards a common purpose, such as the processes and controls described herein. An example of a distributed controller for such purposes would be one or more integrated circuits on a chamber in communication with one or more integrated circuits located remotely (such as at the platform level or as part of a remote computer) that combine to control a process on the chamber.

Without limitation, example systems may include a plasma etch chamber or module, a deposition chamber or module, a spin-rinse chamber or module, a metal plating chamber or module, a clean chamber or module, a bevel edge etch chamber or module, a physical vapor deposition (PVD) chamber or module, a chemical vapor deposition (CVD) chamber or module, an atomic layer deposition (ALD) chamber or module, an atomic layer etch (ALE) chamber or module, an ion implantation chamber or module, a track chamber or module, and any other semiconductor processing systems that may be associated or used in the fabrication and/or manufacturing of semiconductor wafers.

As noted above, depending on the process step or steps to be performed by the tool, the controller might communicate with one or more of other tool circuits or modules, other tool components, cluster tools, other tool interfaces, adjacent tools, neighboring tools, tools located throughout a factory, a main computer, another controller, or tools used in material transport that bring containers of wafers to and from tool locations and/or load ports in a semiconductor manufacturing factory.

What is claimed is:

1. A system for performing a bevel cleaning process on a substrate, the system comprising:
    a substrate support including an electrode, wherein at least a portion of the electrode is embedded within a dielectric; and
    a plurality of plasma needles arranged around a perimeter of the substrate support, wherein the plasma needles are in fluid communication with a gas delivery system and are configured to (i) supply reactive gases from the gas delivery system to a bevel region of the substrate when the substrate is arranged on the substrate support and (ii) electrically couple to the electrode of the substrate support and generate plasma around the bevel region of the substrate.

2. The system of claim 1, further comprising a central injector configured to supply a purge gas above the substrate while the plasma is generated around the bevel region of the substrate.

3. The system of claim 1, wherein the plurality of plasma needles includes N plasma needles arranged at respective ones of N azimuthal positions around the substrate support.

4. The system of claim 3, wherein the N plasma needles are uniformly spaced around the substrate support.

5. The system of claim 3, wherein the substrate support is configured to rotate.

6. The system of claim 5, further comprising an actuator configured to rotate the substrate support.

7. The system of claim 6, further comprising a controller configured to control rotation of the substrate support using the actuator to control exposure of different portions of the bevel region to the plasma.

8. The system of claim 7, wherein the controller is configured to rotate the substrate support based on data indicative of characteristics of the substrate.

9. The system of claim 1, wherein the plurality of plasma needles includes M plasma needles, and wherein the M plasma needles include N pairs of the plasma needles arranged at respective ones of N azimuthal positions around the substrate support.

* * * * *